United States Patent [19]
Mattos

[11] Patent Number: 5,914,618
[45] Date of Patent: Jun. 22, 1999

[54] OPTIMUM NOISE ISOLATED I/O WITH MINIMIZED FOOTPRINT

[75] Inventor: Derwin W. Mattos, Sunnyvale, Calif.

[73] Assignee: VLSI Technology, Inc., San Jose, Calif.

[21] Appl. No.: 08/814,875

[22] Filed: Mar. 11, 1997

[51] Int. Cl.⁶ ............................................. H03K 19/0185
[52] U.S. Cl. ................................. 326/87; 326/27; 326/58; 326/83
[58] Field of Search ................................. 326/83, 86–87, 326/26–27, 57–58, 121; 327/379–380, 384, 387

[56] References Cited

U.S. PATENT DOCUMENTS

| | | | |
|---|---|---|---|
| 5,121,003 | 6/1992 | Chuang et al. | 326/26 |
| 5,426,376 | 6/1995 | Wong et al. | 326/27 |
| 5,534,791 | 7/1996 | Mattos et al. | 326/27 |
| 5,717,343 | 2/1998 | Kwong | 326/27 |

*Primary Examiner*—Jon Santamauro
*Attorney, Agent, or Firm*—Wagner, Murabito&Hao

[57] ABSTRACT

An I/O buffer with minimized footprint; which is less susceptible to voltage spikes caused by switching noise, and which is adapted for used in a separate power bus arrangement. The buffer minimizes voltage spikes caused by switching noise by replacing the single large current surge that occurs during switching with smaller current surges at different times. This is accomplish by having two different drivers for the transitional and holding phases: a Transient Switching Circuit (TSC) and a Logic Holding Circuit (LHC). Generally, the TSC is operational to cause a change in the output signal when there is a change in the input signal. Conversely, the LHC is operational subsequent to the logic transition occurrence at the input signal to bring the output signal to the rail voltage.

18 Claims, 8 Drawing Sheets

OPTIMUM NOISE ISOLATED I/O WITH MINIMIZED FOOTPRINT

BACKGROUND OF THE INVENTION

1. Field of the Invention

The invention generally relates to integrated circuit input/output (I/O) buffers, and more particularly relates to techniques for minimizing the effects of switching noise.

2. Prior Art

Due to advances in technology, integrated circuits can now operate at extremely high speeds (e.g., very small response time between a change at the input and a corresponding change at the output). At these high speeds, switching noises can cause adverse effects on the power supply stability of integrated circuits. The reason is power and ground lines in integrated circuits have inherent inductances. For example, during switching from low to high and vice versa of a complementary metal oxide semiconductor (CMOS) integrated device, current is required to charge and discharge the device capacitive load which results in a change in current flow. Such current changes produce a voltage across the inductances inherent in power and ground lines. Consequently, a "voltage droop" may occur in the power voltage (Vdd) and/or a "ground bounce" may occur in the source voltage (Vss) during switching. These voltage spikes can result in erroneous data transitions. Additionally, by reducing the voltage operating range, voltage spikes can cause undesirable operating delays.

The adverse effects caused by voltage spikes are particularly prevalent when multiple circuits, such as I/O buffer circuits, share the same ground line and power line. As an example, while some I/O buffer circuits may undergo simultaneous switching from high to low, other I/O buffer circuits may remain unswitched by design. When the simultaneous switching I/O buffers changes from high to low, a relatively large current flows through the common ground line to turn the switching I/O buffers off. The change of current flow coupled with the ground line's inherent inductance causes a ground bounce which may turn the unswitched I/O buffers on erroneously.

One solution to minimize voltage spikes caused by switching noise is to replace the single large current surge that occurs during switching with smaller current surges at different times. The embodiments of the above solution are described in U.S. Pat. No. 5,426,376 and its continuation-in-part U.S. Pat. No. 5,534,791 which are assigned to VLSI Technology, Inc, the same assignee for the present invention. As described by U.S. Pat. No. 5,534,791 and U.S. Pat. No. 5,426,376, the task of replacing one single large current surge by smaller current surges at different times can be accomplished by providing within each I/O buffer two separate drivers: a Transient Switching Circuit (TSC) (hereinafter AC driver) and a Logic Holding Circuit (LHC) (hereinafter DC driver). Generally, the AC driver is operational from a time just after the occurrence of a transition on the input signal of the I/O buffer to a time prior to when the rail voltage is reached. Conversely, the DC driver is operational from a time just prior to when the AC driver turns off to a time at which a subsequent logic transition occurs at the input signal. Hence, the operational phases of the AC and DC drivers have a little overlap.

While the I/O buffer circuit in U.S. Pat. No. 5,426,376 can be used in either shared power bus or separate power bus arrangements, the I/O buffer circuit in U.S. Pat. No. 5,534,791 is used in a separate power bus arrangement. In other words, the invention in U.S. Pat. No. 5,534,791 has separate power and ground sources for its AC and DC driver circuits. In a separate power bus arrangement, voltage spikes caused by switching noise can be best minimized by not turning the DC driver on until the output transition is substantially complete and the AC driver has been or is about to be turned off. In doing so, the combined effects of switching noises from the AC and DC drivers are minimized.

Moreover, the effects of switching noise are further minimized, as described by U.S. Pat. No. 5,534,791, by making the DC driver independent of the output voltage after the DC driver has been activated. In doing so, voltage oscillations at the output terminal can be prevented from causing the DC driver to switch on and off erroneously. The I/O buffer circuit in U.S. Pat. No. 5,534,791 achieves these objectives. However, I/O buffer in U.S. Pat. No. 5,534,791 requires 32 transistors. In integrated circuits design, an important consideration is the optimum number of transistors required in a device. The reason is extra transistors mean additional manufacturing costs as well as less space for implementing additional functions. This has added importance given the number of devices in a typical integrated circuit.

Thus, a need exists for an I/O buffer with a minimized footprint, which is less susceptible to voltage spikes caused by switching noise and which is adapted for use in a separate power bus arrangement.

SUMMARY OF THE INVENTION

Accordingly, the present invention provides an I/O buffer with a minimized footprint, which is less susceptible to voltage spikes caused by switching noise and which is adapted for use in a separate power bus arrangement.

The present invention meets the above needs with a noise-isolated I/O buffer comprising an output terminal, a level shifting circuit, a first switching circuit, a second switching circuit, a first transistor, a second transistor, a third transistor, a fourth transistor, a first latching circuit, and a second latching circuit.

In response to receiving an input signal and an output signal from the output terminal, the level shifting circuit generates a first level shifting signal and a second level shifting signal indicating relative voltage levels of the input and output signals. The first and second level shifting signals are provided to the first and second switching circuits, respectively.

Based on the input signal and the first level shifting signal, the first switching circuit generates a first pair of control signals. Similarly, based on the input signal and the first level shifting signal, the second switching circuit generates a second pair of control signals. The first and second pair of control signals are used to turn the first, second, third, and fourth transistors on and off to control the output signal at the output terminal.

The first latching circuit is connected between the level shifting circuit and the first switching circuit to maintain a first signal of the first pair of control signals in a state until there is a change in the input signal. Similarly, the second latching circuit is connected between the level shifting circuit and the second switching circuit, the second latching circuit maintaining a first signal of the second pair of control signals in a state until there is a change in the input signal.

In response to the appropriate control signals indicating that there is a change in the input signal, the first and second transistors cause a logic level of the output terminal to be switched. The first and second transistors are turned off in the absence of a change in the input signal. In response to the appropriate control signals indicating that there is not a change in the input signal, the third and fourth transistors causing the logic level of the output terminal to be maintained. The third and fourth transistors are turned off in response to a change in the input signal.

All the features and advantages of the present invention will become apparent from the following detailed description of its preferred embodiment whose description should be taken in conjunction with the accompanying drawings.

DETAILED DESCRIPTION OF THE INVENTION

In the following detailed description of the present invention, numerous specific details are set forth in order to provide a thorough understanding of the present invention. However, it will be obvious to one skilled in the art that the present invention may be practiced without these specific details. In other instances well known methods, procedures, components, and circuits have not been described in detail as not to unnecessarily obscure aspects of the present invention. Despite the difference in structure, the present invention has many characteristics that the invention in U.S. Pat. No. 5,534,791 has, which is herein incorporated by reference in its entirety.

Figure 1:
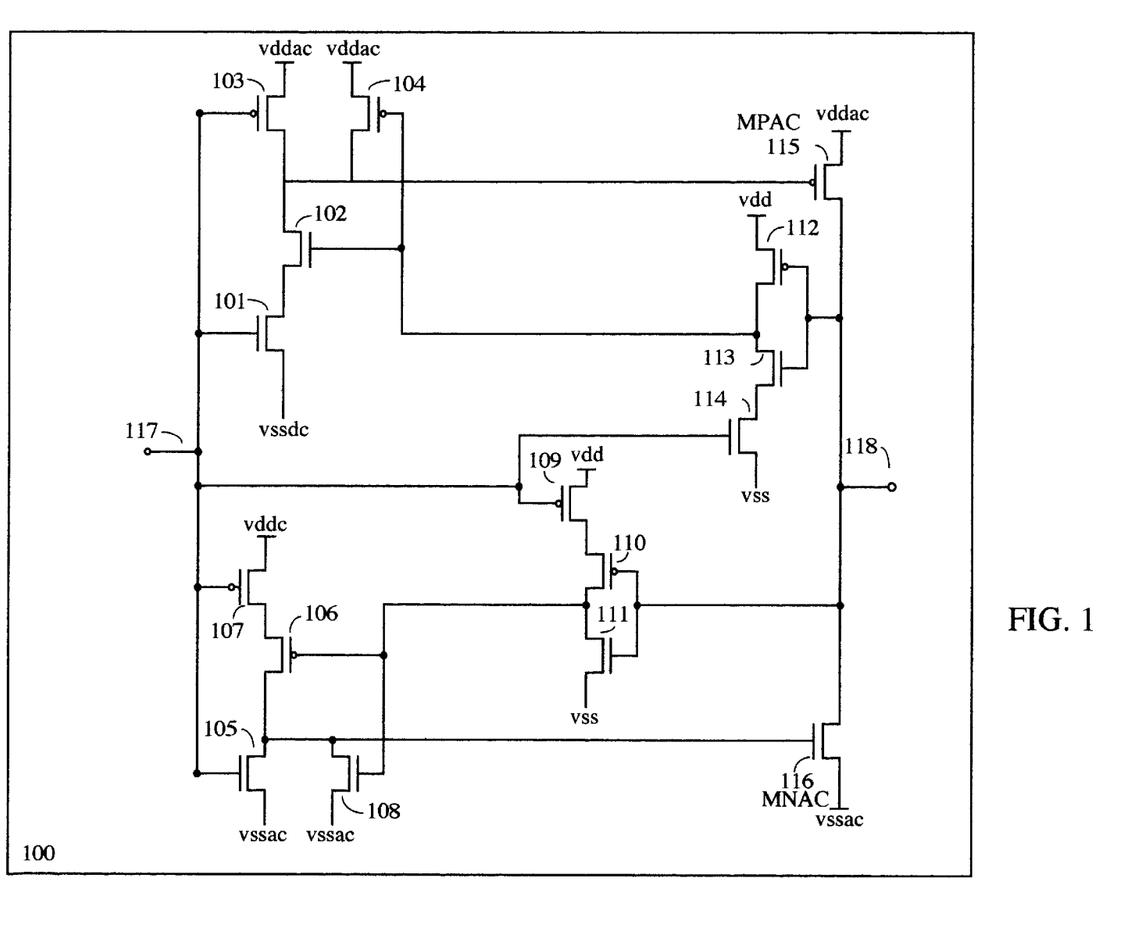
FIG. 1 illustrates a gate-level schematic of the AC driver portion of an I/O buffer circuit.

Reference is made to FIG. 1 illustrating a gate-level embodiment of the AC driver portion of an I/O buffer circuit in accordance to the present invention. AC driver 100 is designed to cause the voltage level of the output signal at the output terminal to switch in response to a change in the input signal received at the input terminal. The AC driver 100 is operational from a time just after the occurrence of a transition of the input signal of the I/O buffer to a time prior to when the rail voltage is reached by the output signal. AC driver 100 includes driver transistors p-mos FET 115 (hereinafter MPAC) and n-mos FET 116 (hereinafter MNAC) and associated circuitry to carry out the above function. Moreover, AC driver 100 will switch on and off in response to the I/O buffer output voltage fluctuations to aid DC driver 200 of FIG. 2 in maintaining the desired output level in a contingency.

AC driver 100 can be divided into an upper half portion and a lower half portion. The upper half portion consists of p-mos FETs MPAC, 103, 104 and 112 as well as n-mos FETs 101, 102, 113, and 114. N-mos FET 101, n-mos FET 102, and p-mos FET 103 are connected in series. More particularly, for n-mos FET 101 (which is shared with DC driver 200), its source is connected to the DC driver ground source Vss, its gate is connected to input terminal 117, and its drain is connected to the source of n-mos FET 102. The gate of n-mos FET 102 is connected to the gate of p-mos FET 104 and the source of n-mos FET 102 is connected to the drain of p-mos FET 103. The source and gate of p-mos FET 103 is connected to the AC driver power source Vdd and the gate of p-mos FET 103 is connected to input terminal 117, respectively.

P-mos FET 104 is in turn connected in parallel to p-mos FET 103. The drain of p-mos FET 104 is connected to the drain of p-mos FET 103, the gate of p-mos FET 104 is connected to the gate of n-mos FET 102, and the source of p-mos FET 104 is connected to the AC driver power source Vdd.

For p-mos FET MPAC, its source is connected to the AC driver power source Vdd, its gate is connected to the drain of p-mos FET 104, and its drain is connected to output terminal 118. Output terminal 118 is connected to the gate of p-mos FET 112 whose source is connected to the core power source Vdd and whose drain is connected to the drain of n-mos FET 113. The drain of n-mos FET 113 is also connected to the gates of p-mos FET 104 and n-mos FET 102. The gate of n-mos FET 113 is connected to output terminal 118 and the source of n-mos FET 113 is connected to the drain of n-mos FET 114. The gate of n-mos FET 114 is connected to input terminal 117 and the drain of n-mos FET 114 is connected to the core ground source Vss. P-mos FET 112, n-mos FET 113, and n-mos FET 114 are shared with the DC driver 200.

In so doing, the upper half portion of AC driver 100 is designed to cause the LOW voltage level of the output signal at output terminal 118 to switch to HIGH in response to a change from a LOW voltage level to a HIGH voltage level in the input signal received at input terminal 117. In cases where there is a change from a HIGH voltage level to a LOW voltage level in the input signal or when there is no change in the input signal, the upper half of AC driver 100 does not cause the output signal at output terminal 118 to switch its current voltage level.

As an example of the operation of the upper half portion of AC driver 100, consider the case where the input signal is HIGH and the output signal is LOW. In this case, having a HIGH voltage level at input terminal 117 turns p-mos FET 103 off, n-mos FET 101 on, and n-mos FET 114 on. Because p-mos FET 103 is off, the AC driver power voltage Vdd is prevented from being connected to its drain. Conversely, because n-mos FETs 101 and 114 are on, the ground voltage Vss is connected to their drains.

At the same time, having a LOW voltage level at output terminal 118 turns p-mos FET 112 on and n-mos FET 113 off. Hence, although n-mos FET 114 is on, the ground voltage Vss is not connected to the drain of n-mos FETs 113 because n-mos FET 113 is off. As such, the drain of p-mos FET 112 is connected to the core power voltage Vdd. Since the drain of p-mos FET 112 is connected to the gates of p-mos FET 104 and n-mos FET 102, p-mos FET 104 is turned off and n-mos FET 102 is turned on. Since both n-mos FETs 101 and 102 are turned on, the ground voltage Vss is connected to the drain of n-mos FET 102 which turns p-mos FET MPAC on. Because p-mos FET MPAC is on, power voltage Vdd is provided to output terminal 118 and drives it HIGH.

Assume, for example, that the input voltage at terminal 117 remains HIGH and that a drop occurs in the output voltage at terminal 118 to LOW. In the above example, having a HIGH voltage at its gate keeps n-mos FET 101 on. At the same time, having a LOW voltage at its gate turns p-mos 112 on. Hence, the power voltage Vdd is supplied to the gate of n-mos FET 102 turning it on. As a result, the ground voltage Vss is connected to the drain of n-mos FET 102 thereby turning p-mos FET MPAC on to drive output terminal 118 HIGH. As shown, AC driver 100 switches on and off to stabilize undesirable output voltage fluctuations. The operation of the upper half portion of AC driver 100 having different voltage states can be determined by following the same logic above.

The lower half portion consists of p-mos FETS 106, 107, 109, and 110 as well as n-mos FETs 105, 108, 111, and MNAC. N-mos FET 105, p-mos FET 106, and p-mos FET 107 are connected in series. More particularly, for n-mos FET 105, its source is connected to the AC driver ground source Vss, its gate is connected to input terminal 117, and its drain is connected to the drain of p-mos FET 106. The gate of p-mos FET 106 is connected to the gate of n-mos FET 108 and the source of p-mos FET 106 is connected to the drain of p-mos FET 107. The source and gate of p-mos FET 107 (which is shared with DC driver 200) is connected to the DC driver power source Vdd and input terminal 117, respectively.

N-mos FET 108 is in turn connected in parallel to n-mos FET 105. The drain of n-mos FET 108 is connected to the drain of n-mos FET 105, the gate of n-mos FET 108 is connected to the gate of p-mos FET 106, and the source of n-mos FET 108 is connected to the AC driver ground source Vss.

For n-mos FET MNAC, its source is connected to the AC driver ground source Vss, its gate is connected to the drain of n-mos FETs 105 and 108, and its drain is connected to output terminal 118. Output terminal 118 is connected to the gate of n-mos FET 111 whose source is connected to the core ground source Vss and whose drain is connected to the drain of p-mos FET 119. The drain of p-mos FET 110 is also connected to the gates of p-mos FET 106 and n-mos FET 108. The gate of p-mos FET 110 is connected to output terminal 118 and the source of p-mos FET 110 is connected to the drain of p-mos FET 109. The gate of p-mos FET 109 is connected to input terminal 117 and the source of p-mos FET 109 is connected to the core power source Vdd. P-mos FET 109, p-mos FET 110, and n-mos FET 111 are shared with the DC driver 200.

In so doing, the lower half portion of AC driver 100 is designed to cause the HIGH voltage signal at output terminal 118 to switch to LOW in response to a change from a HIGH voltage level to a LOW voltage level in the input signal received at input terminal 117. In cases where there is a change from a LOW voltage level to a HIGH voltage level in the input signal or when there is no change in the input signal, the lower half of AC driver 100 does not cause the output signal at output terminal 118 to switch its current voltage level.

As an example of the operation of the lower half portion of AC driver 100, consider the case where the input signal is LOW and the output signal is HIGH. In this case, having a LOW voltage at input terminal 117 turns n-mos FET 105 off, p-mos FET 107 on, and p-mos FET 109 on. Because n-mos FET 105 is off, the AC driver ground voltage Vss is prevented from being connected to its drain. Conversely, because p-mos FETs 107 and 109 are on, the power voltage Vdd is connected to their drains.

At the same time, having a HIGH voltage at output terminal 118 turns n-mos FET 111 on and p-mos FET 110 off. Hence, although p-mos FET 109 is on, the power voltage Vdd is not connected to the drain of p-mos FET 110 because p-mos FET 110 is off. As such, the drain of n-mos FET 111 is connected to the core ground voltage Vss. Since the drain of n-mos FET 111 is connected to the gates of p-mos FET 106 and n-mos FET 108, p-mos FET 106 is turned on and n-mos FET 108 is turned off. Since both p-mos FETs 106 and 107 are turned on, the power voltage Vdd is connected to the drain of p-mos FET 106 which turns n-mos FET MNAC on. Because n-mos FET MNAC is on, ground voltage Vss is provided to output terminal 118 and drives it LOW.

Assume, for example, that the input voltage at terminal 117 remains LOW and that a rise occurs in the output voltage at terminal 118 to HIGH. In the above example, having a LOW voltage at its gate keeps p-mos FET 107 on. At the same time, having a HIGH voltage at its gate turns n-mos 111 on. Hence, the ground voltage Vss is supplied to the gate of p-mos FET 106 turning it on. As a result, the power voltage Vdd is connected to the drain of p-mos FET 106 thereby turning n-mos FET MNAC on to drive output terminal 118 LOW. As shown, AC driver 100 switches on an off to stabilize undesirable output voltage fluctuations. The operation of the lower half portion of AC driver 100 having different voltage states can be determined by following the same logic above.

Figure 2:
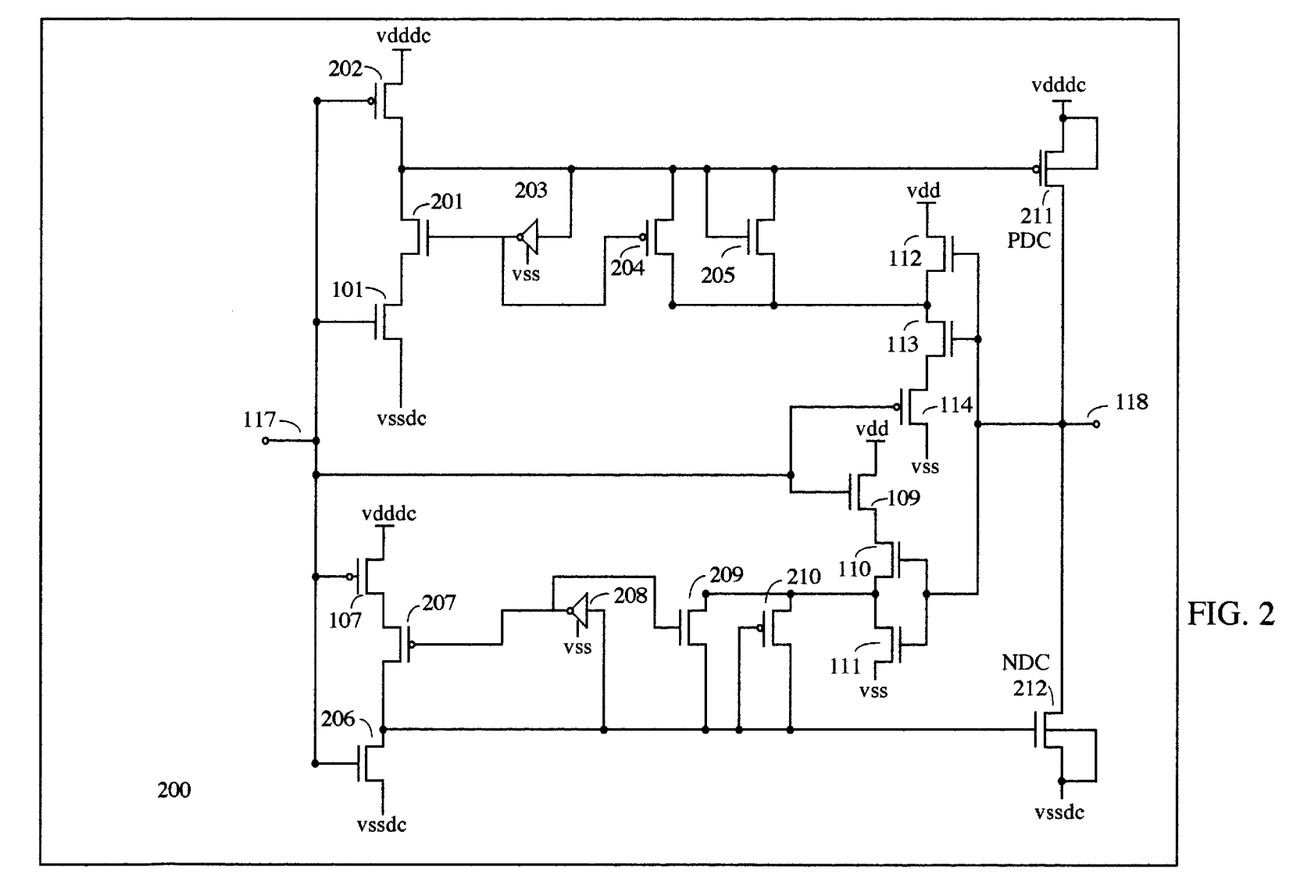
FIG. 2 illustrates a gate-level schematic of the DC driver portion of an I/O buffer.

Reference is made to FIG. 2 illustrating a gate-level embodiment of the DC driver portion of an I/O buffer circuit in accordance with the present invention. DC driver 200 is designed to pull the output signal at the output terminal to the rail voltage (e.g., the DC driver power voltage Vdd or ground voltage Vss). Hence, DC driver 200 is inactive for substantially all of the period when there is a transition of the input signal. DC driver 200 includes driver transistors p-mos FET 211 (hereinafter PDC) and n-mos FET 212 (hereinafter NDC) and associated circuitry to carry out the above function.

DC driver 200 can be divided into an upper half portion and a lower half portion. The upper half portion consists of p-mos FETs PDC, 202, and 112, n-mos FETs 101, 201, 205, 113, and 114, as well as inverter 203. Alternatively, p-mos FET 204 may be added to improve the reliability and performance of DC driver 200. N-mos FET 101, n-mos FET 201, and p-mos FET 202 are connected in series. More particularly, for n-mos FET 101, its source is connected to the DC driver ground source Vss, its gate is connected to input terminal 117, and its drain is connected to the source of n-mos FET 201. The gate of n-mos FET 201 is connected to the output of inverter 203 and the drain of n-mos FET 201 is connected to the drain of p-mos FET 202. The source of p-mos FET 202 is connected to the DC driver power source Vdd and the gate of p-mos FET 202 is connected to input terminal 117, respectively.

The drain of p-mos FET 202 is supplied as an input to inverter 203. Inverter 203 together with n-mos FET 201 act as a latching mechanism to ensure that the I/O buffer is latched in a condition until a subsequent charge in the input signal. In this condition, the I/O buffer is independent of the output signal.

In addition to being supplied to the gate of n-mos FET 201, the output of inverter 203 is supplied to the gate of p-mos FET 204. The source of p-mos FET 204 is connected to the drain of p-mos FET 202 and the drain of p-mos FET 204 is connected to the drain of p-mos FET 112. N-mos FET 205 is connected in parallel to p-mos FET 204. The source of n-mos FET 205 is connected to the drain of p-mos FET 112 and the drain of n-mos FET 205 is connected to the drain of p-mos FET 202. To turn on the gate of p-mos FET PDC, n-mos FET 205 may be adequate if it is sized correctly. Alternatively, p-mos FET 204 may be added to improve the reliability and the rate at which the gate of p-mos FET PDC is charged. More specifically, p-mos FETs and n-mos FETs have different voltage thresholds which determine their switching speeds. By using two different types of FETs, the lowest of the two voltage thresholds is achieved and the gate of PDC is pulled to the lowest voltage possible to more reliably switch transistor 203.

For p-mos FET PDC 211, its source is connected to the DC driver power source Vdd, its gate is connected to the drain of p-mos FET 202, and its drain is connected to output terminal 118. Output terminal 118 is connected to the gate of p-mos FET 112 whose source is connected to the core power source Vdd and whose drain is connected to the drain of n-mos FET 113. The gate of n-mos FET 113 is connected to output terminal 118 and the source of n-mos FET 113 is connected to the drain of n-mos FET 114. The gate of n-mos FET 114 is connected to input terminal 117 and the drain of n-mos FET 114 is connected to the core ground source Vss.

In so doing, the upper half portion of DC driver 200 is designed to pull the output signal up to the rail voltage of DC driver power voltage Vdd following a transition from a LOW voltage level to a HIGH voltage level in the input signal received at input terminal 117. In cases following a transition from a HIGH voltage level to a LOW voltage level in the input signal or when there is no change in the input signal, the upper half of DC driver 200 does not affect the output signal at output terminal 118.

As an example of the operation of the upper half portion of DC driver 200, first consider the case where the input signal is LOW and the output signal is LOW. In this case, having a LOW voltage level at input terminal 117 turns p-mos FET 202 on, n-mos FET 101 off, and n-mos FET 114 off. Because p-mos FET 202 is on, the DC driver power voltage Vdd is connected to its drain thereby turning p-mos FET PDC 211 off. As a result, the power voltage Vdd is not connected to output terminal 118. Conversely, because n-mos FETs 101 and 114 are off, the ground voltage Vss is not connected to their drains.

At the same time, having a LOW voltage level at output terminal 118 turns p-mos FET 112 on and n-mos FET 113 off. As such, the drain of p-mos FET 112 is connected to the power voltage Vdd and n-mos FET 113 cuts off ground voltage Vss from reaching the drain of p-moss FET 112.

The HIGH voltage level provided at the drain of p-mos FET 202 turns n-mos FET 205 on. However, because the voltage at the drain of p-mos FET 202 is already HIGH, p-mos FET PDC 211 is turned off. The HIGH voltage level at the drain of p-mos FET 202 is inverted into a LOW voltage level by inverter 203 which results in n-mos FET 201 being turned off. As long as n-mos FET 201 is turned off, the voltage level at the drain of p-mos FET 202 remains HIGH thereby ensuring that the voltage level at output terminal remains LOW until there is a transition in the input signal from LOW to HIGH. The LOW voltage at the output of inverter 203 turns p-mos FET 204 on. Because the voltage at the drain of p-mos FET 202 is already HIGH, this causes p-mos FET PDC to turn off. Because p-mos FET PDC is turned off, power voltage Vdd is not connected to the drain of p-mos FET PDC 211 which causes the output voltage to remain LOW.

Following an input signal transition from LOW to HIGH voltage, p-mos FET 202 is turned off, n-mos FET 101 on, and n-mos FET 114 on. Because n-mos FET 201 is off, the ground voltage Vss is not connected to the drain of n-mos FET 201 to drive it low. Additionally, because p-mos FET 202 is off, the power voltage Vdd is not connected to the drain of n-mos FET 201. As a result, the voltage at the drain of n-mos FET 201 remains HIGH. Since the voltage at the drain of n-mos FET 201 is HIGH, n-mos FET 205 is turned on and the output voltage of inverter 203 is LOW. Because the output voltage of inverter 203 is LOW, p-mos FET 204 is on.

After AC driver 100 drives the voltage at output terminal 118 HIGH in response to the HIGH input signal, n-mos FET 113 is turned on which allows the ground voltage Vss to connect to the drain of n-mos FET 113. This creates sink currents across p-mos FET 204 and n-mos FET 205 causing the voltage at the drain of p-mos FET 202 to go LOW. This LOW voltage turns p-mos PDC 211 to turns on and connects the power voltage Vdd to output terminal 118 thereby pulling it HIGH.

At the same time, having a LOW voltage level at output terminal 118 turns p-mos FET 112 on and n-mos FET 113 off. As such, the drain of p-mos FET 112 is connected to the power voltage Vdd and n-mos FET 113 cuts off ground voltage Vss from reaching the drain of p-moss FET 112.

The HIGH voltage level provided at the drain of p-mos FET 202 turns n-mos FET 205 on which causes a current to flow across to charge up the gate of p-mos FET PDC 211. This causes p-mos FET PDC 211 to turn off. The HIGH voltage level at the drain of p-mos FET 202 is inverted into a LOW voltage level by inverter 203 which results in n-mos FET 201 being turned off. As long as n-mos FET 201 is turned off, the voltage level at the drain of p-mos FET 202 remains HIGH thereby ensuring that the voltage level at output terminal remains LOW until there is a transition in the input signal from LOW to HIGH. The LOW voltage at the output of inverter 203 turns p-mos FET 204 on which allows a current to flow across to charge up the gate of p-mos FET PDC 211. This causes p-mos FET PDC 211 to turn off. Because p-mos FET PDC is turned off due to currents across p-mos FET 204 and n-mos FET 205, power voltage Vdd is not connected to the drain of p-mos FET PDC which causes the output voltage to remain LOW.

The lower half portion of DC driver 200 consists of p-mos FETs 107, 110, 109, 207 and 210, n-mos FETs NDC, 206, and 111, as well as inverter 208. Alternatively, n-mos FET 209 may be added to improve the reliability and performance of DC driver 200. P-mos FET 107, p-mos FET 207, and n-mos FET 206 are connected in series. More particularly, for n-mos FET 206, its source is connected to the DC driver ground source Vss, its gate is connected to input terminal 117, and its drain is connected to the drain of p-mos FET 207. The gate of p-mos FET 207 is connected to the output of inverter 208 and the source of p-mos FET 207 is connected to the drain of p-mos FET 107. The source of p-mos FET 107 is connected to the DC driver power source Vdd and the gate of p-mos FET 202 is connected to input terminal 117, respectively.

The drain of n-mos FET 206 is supplied as an input to inverter 208. Inverter 208 together with p-mos FET 207 act as a latching mechanism to ensure that the I/O buffer is latched in a condition until a subsequent change in the input signal. In this condition, the I/O buffer is independent of the output signal.

In addition to being supplied to the gate of p-mos FET 207, the output of inverter 208 is supplied to the gate of n-mos PET 209. The source of n-mos FET 209 is connected to the drain of n-mos FET 206 and the drain of n-mos FET 209 is connected to the drain of n-mos FET 111. P-mos FET 210 is connected in parallel to n-mos FET 209. The source of p-mos FET 210 is connected to the drain of n-mos FET 111 and the drain of p-mos FET 210 is connected to the drain of n-mos FET 206. To turn on the gate of n-mos FET NDC, p-mos FET 210 may be adequate if it is sized correctly. Alternatively, n-mos FET 209 may be added to improve the reliability and the rate at which the gate of n-mos FET NDC is charged. The reason is that p-mos FET and n-mos FET have different voltage thresholds which determine their switching speeds. By using two different types of FETs, an average of the two voltage thresholds is achieved. Moreover, using two FETs means that their sizes can be made smaller.

For n-mos FET NDC 212, its source is connected to the DC driver ground source Vss, its gate is connected to the drain of n-mos FET 206, and its drain is connected to output terminal 118. Output terminal 118 is connected to the gate of n-mos FET 111 whose source is connected to the core ground source Vss and whose drain is connected to the drain of p-mos FET 110. The gate of p-mos FET 110 is connected to output terminal 118 and the source of p-mos FET 110 is connected to the drain of p-mos FET 109. The gate of p-mos FET 109 is connected to input terminal 117 and the drain of p-mos FET 109 is connected to the core power source Vdd.

In so doing, the lower half portion of DC, driver 200 is designed to pull the output signal dozen to the rail voltage of DC driver ground voltage Vss following a transition from a HIGH voltage level to a LOW voltage level in the input signal received at input terminal 117. In cases following a transition from a LOW voltage level to a HIGH voltage level in the input signal or when there is no change in the input signal, the upper half of DC driver 200 does not affect the output signal at output terminal 118.

As an example of the operation of the upper half portion of DC driver 200, first consider the case where the input signal is HIGH and the output signal is HIGH. In this case, having a HIGH voltage level at input terminal 117 turns n-mos FET 206 on, p-mos FET 107 off, and p-mos FET 109 off. Because n-mos FET 206 is on, the DC driver ground voltage Vss is connected to its drain thereby turning n-mos FET NDC 212 off. As a result, the ground voltage Vss is not connected to output terminal 118. Conversely, because p-mos FETs 107 and 109 are off, the DC driver power voltage Vdd is not connected to their drains.

At the same time, having a HIGH voltage level at output terminal 118 turns n-mos FET 111 on and p-mos FET 110 off. As such, the drain of n-mos FET 111 is connected to the ground voltage Vss.

The LOW voltage level provided at the drain of n-mos FET 206 turns p-mos FET 210 on. However, because the voltage at the drain of n-mos FET 206 is already LOW, n-mos FET NDC 212 is turned off. The LOW voltage level at the drain of n-mos FET 206 is inverted into a HIGH voltage level by inverter 208 which results in p-mos FET 207 being turned off. As long as p-mos FET 207 is turned off, the voltage level at the drain of n-mos FET 206 remains LOW thereby ensuring that the voltage level at output terminal remains HIGH until there is a transition in the input signal from HIGH to LOW. The HIGH voltage at the output of inverter 208 turns n-mos FET 209 on. Because the voltage at the drain of n-mos FET 206 is already LOW, this causes n-mos FET NDC 212 to turn off. Because n-mos FET NDC 212 is turned off, ground voltage Vss is not connected to the drain of n-mos FET NDC which causes the output voltage to remain HIGH.

Following an input signal transition from HIGH to LOW voltage, n-mos FET 206 is turned off, p-mos FET 107 on, and p-mos FET 109 on. Because p-mos FET 207 is off, the power voltage Vdd is not connected to the drain of p-mos FET 207 to drive it HIGH. Additionally, because n-mos FET 206 is off, the ground voltage Vss is not connected to the drain of p-mos FET 207. As a result, the voltage at the drain of p-mos FET 207 remains LOW. Since the voltage at the drain of p-mos FET 207 is LOW, P-mos FET 210 is turned on and the output voltage of inverter 208 is HIGH. Because the output voltage of inverter 208 is HIGH, N-mos FET 209 is on.

After AC driver 100 drives the voltage at output terminal 118 LOW in response to the LOW input signal, p-mos FET 110 is turned on which allows the power voltage Vdd to connect to the drain of p-mos FET 110. This creates source currents across n-mos FET 209 and p-mos FET 210 causing the voltage at the drain of n-mos FET 206 to go HIGH. This HIGH voltage turns n-mos NDC on and connects the ground voltage Vss to output terminal 118 thereby pulling it LOW.

Figure 3:
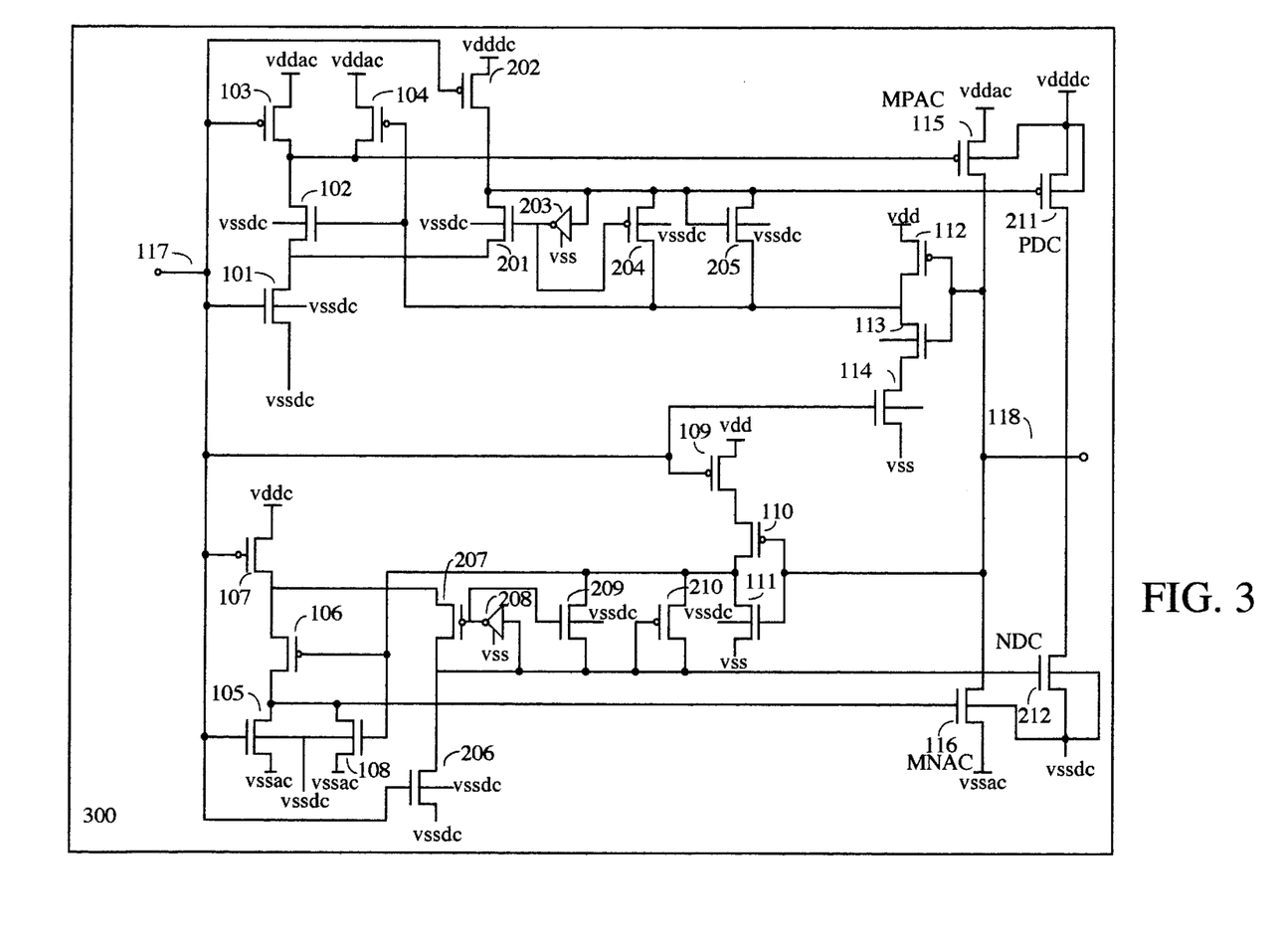
FIG. 3 illustrates a gate-level schematic of a complete I/O buffer in accordance with the preferred embodiment of the present invention implementing the AC driver portion of FIG. 1 and the DC driver portion of FIG. 2.

FIG. 3 illustrates an embodiment of I/O buffer 300 with both AC driver 100 of FIG. 1 and DC driver 200 of FIG. 2 connected to each other in accordance with the present invention. I/O buffer 300 consists of the elements in AC driver 100 and DC driver 200. Because I/O buffer 300 is designed for use with CMOS devices, the size of static current that DC driver 200 is designed to drive is relatively small. As such, when voltage fluctuations occur at output terminal 118 due to contingency such as transmission-line effects, DC driver 100 may not be able to maintain the desired output level. For this reason, AC driver 100 is designed so that it can switch on and off in responses to output voltage fluctuations to aid DC driver 200 in maintain the desired output level in an contingency.

As shown, AC driver 100 and DC driver 200 actually share p-mos FETs 107, 109, 110, 112, n-mos FETs 101, 111, 113, 114, a common input terminal 117, and a common output terminal 118. In the preferred embodiment, I/O buffer 300 is designed to operate with separate power bus arrangements for AC driver 100 and DC driver 200 to minimize voltage spikes caused when the two drivers are sharing power bus arrangement. As such, AC driver 100 are connected to AC power and ground sources while DC driver 200 are connected to DC power and ground sources. However, the shared p-mos FET 107 is connected to the DC driver power source since the DC driver power source has less noise. Similarly, the shared n-mos FET 101 is connected to the DC driver ground source since the DC driver ground source has less noise. On the other hand, n-mos FETs 111 and 114 are connected to the core ground source and p-mos FETs 109 and 112 are connected to the core power source. As shown in FIG. 3, the substrates of inverters 203 and 208, p-mos FET 115, 204, 211, and n-mos FETs 101, 102, 105, 108, 111, 113, 114, 116, 201, 205, 206, 209, and 212 are connected to the DC driver ground source Vss (the quiet ground) so that I/O buffer 300 is less susceptible to voltage spikes from the more noisy AC driver ground source Vss.

AC driver 100 is designed to cause the voltage level of the output signal at the output terminal to switch in response to a change in the input signal received at the input terminal. On the other hand, DC driver 200 is designed to pull the output signal at the output terminal to the rail voltage (e.g., the DC driver power voltage Vdd or ground voltage Vss). However, I/O buffer 300 is designed to assure there is a minimal period of overlap during which both AC driver 100 and DC driver 200 are turned on. Preferably, DC driver 200 is turned on only after the output transition handled by AC driver 100 is substantially complete. This minimizes the voltage spikes that DC driver 200 experiences. For large capacitive loads which may require AC driver 100 to remain on for a prolonged period of time, turning DC driver 200 on only after the output transition is substantially complete takes on greater importance.

Figure 4:
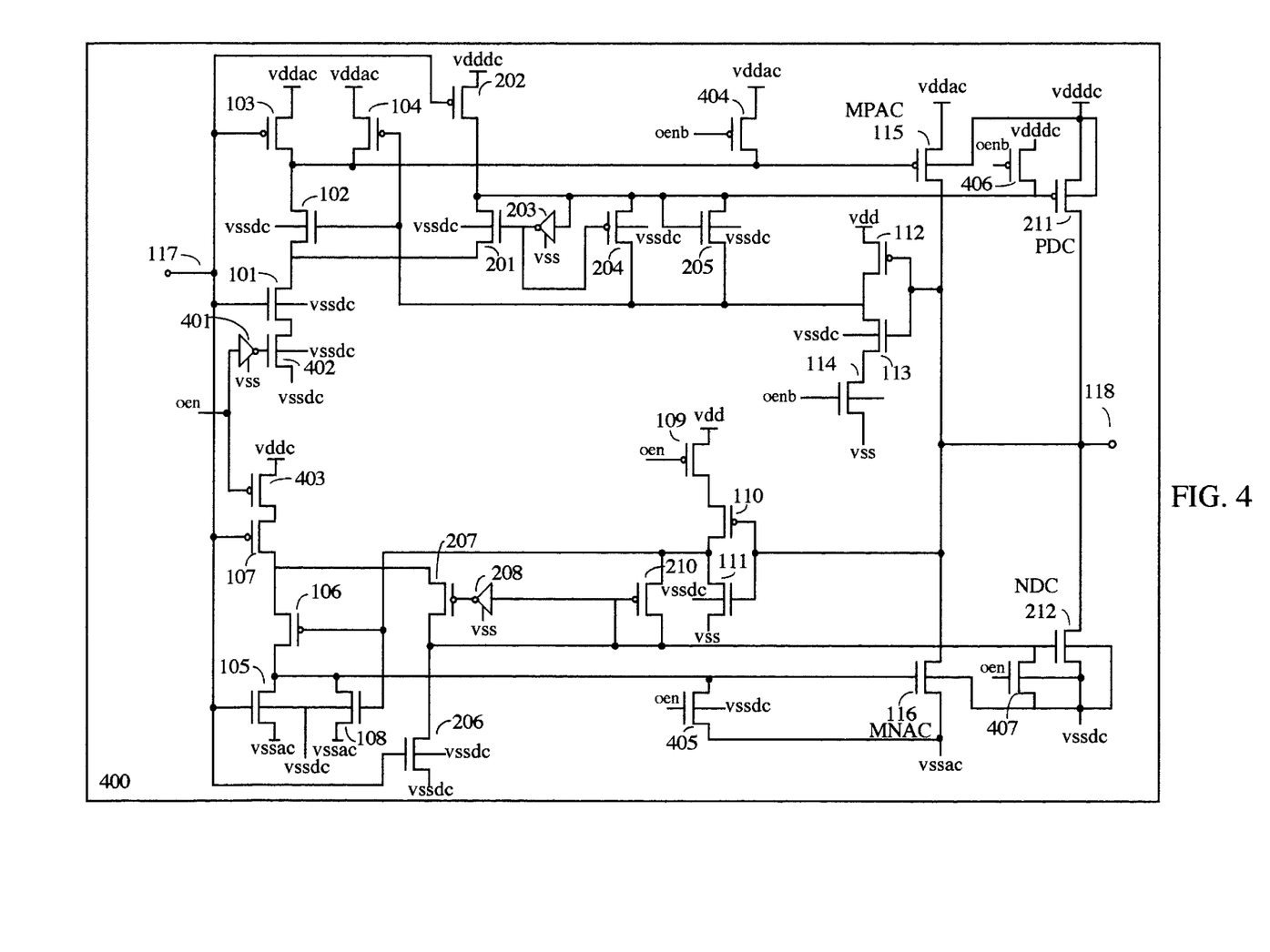
FIG. 4 illustrates a gate-level schematic of the I/O buffer circuit shown in FIG. 3 further including output enable circuitry.

Referring to FIG. 4 an illustration of an embodiment of I/O buffer 300 of FIG. 3 with output enable capability circuitry and without p-mos FET 204 and n-mos FET 209 is shown. As discussed earlier, p-mos FET 204 and n-mos FET 209 may be used in an alternative embodiment to improve the speed of pulling the signal at output terminal 118 to the rail voltage following a transition in the signal at input terminal 117. FIG. 4 shows I/O buffet 300 without p-mos FET 204 and n-mos FET 209.

Because I/O buffers are typically connected to a bus, bus contention is a normal occurrence. In case where an I/O buffer is not granted control of the bus for which it is contending, the I/O buffer needs to be disabled. In FIG. 4, additional devices are added to I/O buffer 300 to provide output enable capability. For AC driver 100, p-mos FETs 403 and 404, n-mos FETs 402 and 405, as well as inverter 401 are added. For n-mos FET 402, its source is connected to the ground source Vss, its drain is connected to the source of n-mos FET 101, and its gate is connected to the output oenb of inverter 401. Inverter 401 receives as an input output enable signal oen. For p-mos FET 403, its source is connected to the power source Vdd, its drain is connected to the source of p-mos FET 107, and its gate is connected to output enable signal oen.

Moreover, for p-mos FET 404, its source is connected to the power source Vdd, its drain is connected to the gate of p-mos FET MPAC 115. and its gate is connected to signal oenb. For n-mos FET 405, its source is connected to the ground source Vss, its drain is connected to the gate of n-mos FET MNAC 116, and its gate is connected to output enable signal oen.

In doing so, when signal oen is HIGH and its invert signal oenb is LOW, n-mos FET 402 is turned off effectively cutting off the ground voltage Vss from the gate of p-mos FET MPAC 115 and p-mos FET 404 is turned on to ensure that power voltage Vdd is supplied to the gate of p-mos FET MPAC 115. When this occurs, the upper half of AC driver 100 is effectively shut off because p-mos FET MPAC 115 is turned off. Similarly, when signal oen is HIGH and its invert signal oenb is LOW, p-mos FET 403 is turned off effectively cutting off the power voltage Vdd from the gate of n-mos FET MNAC 116 and n-mos FET 405 is turned on to ensure that ground voltage Vss is supplied to the gate of n-mos FET MNAC 116. When this occurs, the lower half of AC driver 100 is effectively shut off because n-mos FET MNAC 116 is turned off. Hence, AC driver 100 is turned off.

For DC driver 200, p-mos FETS 403 and 406 as well as n-mos FETs 402 and 407 are added. For n-mos FET 402, its source is connected to the ground source Vss, its drain is connected to the source of n-mos FET 101, and its gate is connected to the output oenb of inverter 401. Inverter 401 receives as an input output enable signal oen. For p-mos FET 403, its source is connected to the power source Vdd, its drain is connected to the source of p-mos FET 107, and its gate is connected to output enable signal oen. As discussed earlier, n-mos FET 402 and p-mos FET 403 are also added in the same way to provide output enable capability to AC driver 100.

For p-mos FET 406, its source is connected to the power source Vdd, its drain is connected to the gate of p-mos FET PDC 211. and its gate is connected to signal oenb. For n-mos FET 407, its source is connected to the ground source Vss, its drain is connected to the gate of n-mos FET NDC 212, and its gate is connected to output enable signal oen. In addition, the gates of p-mos FET 109 and n-mos FET 114 are now connected to output enable signal oen and its inverted counterpart signal oenb.

In doing so, when signal oen is HIGH and its invert signal oenb is LOW, n-mos FET 402 is turned off, thereby effectively cutting off the ground voltage Vss from the gate of p-mos FET PDC 211. Furthermore, p-mos FET 406 is turned on to ensure that power voltage Vdd is supplied to the gate of p-mos FET PDC 211, and n-mos FET 114 is turned off to cut off the ground voltage Vss from the source of n-mos FET 205. When this occurs, the upper half of DC driver 200 is effectively shut off because p-mos FET PDC 211 is turned off. Similarly, when signal oen is HIGH and its invert signal oenb is LOW, p-mos FET 403 is turned off effectively cutting off the power voltage Vdd from the gate of n-mos FET NDC 212, n-mos FET 407 is turned on to ensure that ground voltage Vss is supplied to the gate of n-mos FET MNAC 116, and p-mos FET 109 is turned off to cut off the power voltage Vdd from the source of p-mos FET 210. When this occurs, the lower half of DC driver 200 is effectively shut off because n-mos FET NDC 212 is turned off. Hence, DC driver 200 is turned off.

Furthermore, the substrates of n-mos FETs 402, 405, and 407 are connected to the DC driver ground source Vss (the quiet ground) so that I/O buffer 300 is less susceptible to voltage spikes from the more noisy AC driver ground source Vss.

Figure 5:
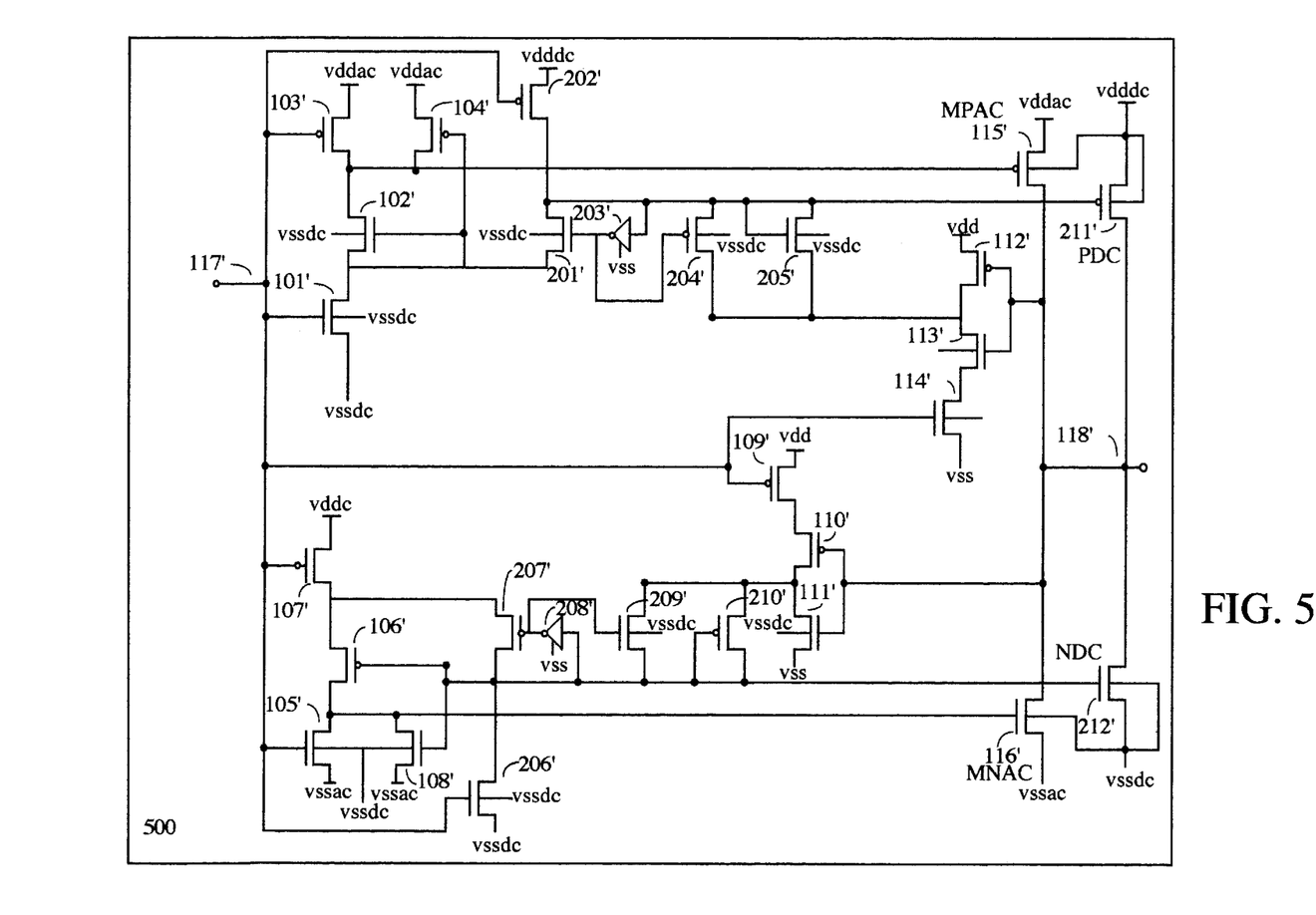
FIG. 5 illustrates a gate-level schematic of a complete I/O buffer in accordance with an alternative embodiment of the present invention.

Referring now to FIG. 5 which illustrates an alternative embodiment of an I/O buffer in accordance with the present invention. I/O buffer 500 of FIG. 5 is similar to I/O buffer 300 in FIG. 3 and like elements are so indicated by primed reference numbers. Because of the similarity between I/O buffer 500 and its counterpart I/O 300, the devices in FIG. 5 that are similar and function in a similar fashion as those in FIG. 3 will not be described in detail again. Rather, only relevant differences between the embodiments will be described. As shown in FIG. 5, I/O buffer 500 includes p-mos FET 204' and n-mos FET 209'. As discussed earlier in FIG. 3, these devices may be added in an alternative embodiment to improve the switching reliability of p-mos FET PDC and n-mos FET NDC respectively.

Because I/O buffer 500 is designed for use with transistor transistor logic (TTL) devices, DC driver 501 must be able to handle the minimum static current required for TTL devices. For this reason, DC driver 501 is normally as strong as AC driver 502. When voltage fluctuations occur due to contingency such as transmission-line effects, DC driver 501 is able to maintain the desired output level. For this reason, it is unnecessary for AC driver 502 to switch on and off to aid DC driver 501 in maintaining the desired output level in a contingency. Rather, to avoid added switching noise, AC driver 502 is designed with the same latching mechanism as the DC driver 501. More particularly, AC driver 502 and DC driver 501 in I/O buffer 500 share the same latching mechanism.

One difference between I/O buffer 300 shown in FIG. 3 and I/O buffer 500 in FIG. 5 is the connection from the source of p-mos FET 204' and the drain of n-mos FET 205, to the gates of n-mos FET 102' and p-mos FET 104' is eliminated. Instead, a connection between the drain of n-mos FET 201' and the gates of n-mos FET 102' and p-mos FET 104' is established. In doing so, the latching mechanism of the upper half portion of DC driver 501 is implemented into the upper half portion of AC driver 502. Another difference is the connection from the source of n-mos FET 209' and the drain of p-mos FET 210' to the gates of n-mos FET 108' and p-mos FET 106' is eliminated. Instead, a connection between the drain of n-mos FET 206' and the gates of n-mos FET 108' and p-mos FET 106' is established. In doing so, the latching mechanism of the lower half portion of DC driver 501 is implemented into the lower half portion of AC driver 502.

Except for the noted differences the rest of the I/O buffer 500 is constructed in the same manner as I/O buffer 300. DC driver 501 is constructed in the same manner as its counterpart DC driver 200 in FIG. 3. For this reason, DC driver 501 is not discussed further. With respect to AC driver 502, however, the noted changes result in p-mos FETs 202' and 204', n-mos FETs 201' and 205', and inverter 203' being incorporated into the upper half portion. The noted changes also result in p-mos FETs 207' and 210', n-mos FETs 206' and 209', and inverter 208' being incorporated into the lower half portion.

Figure 6:
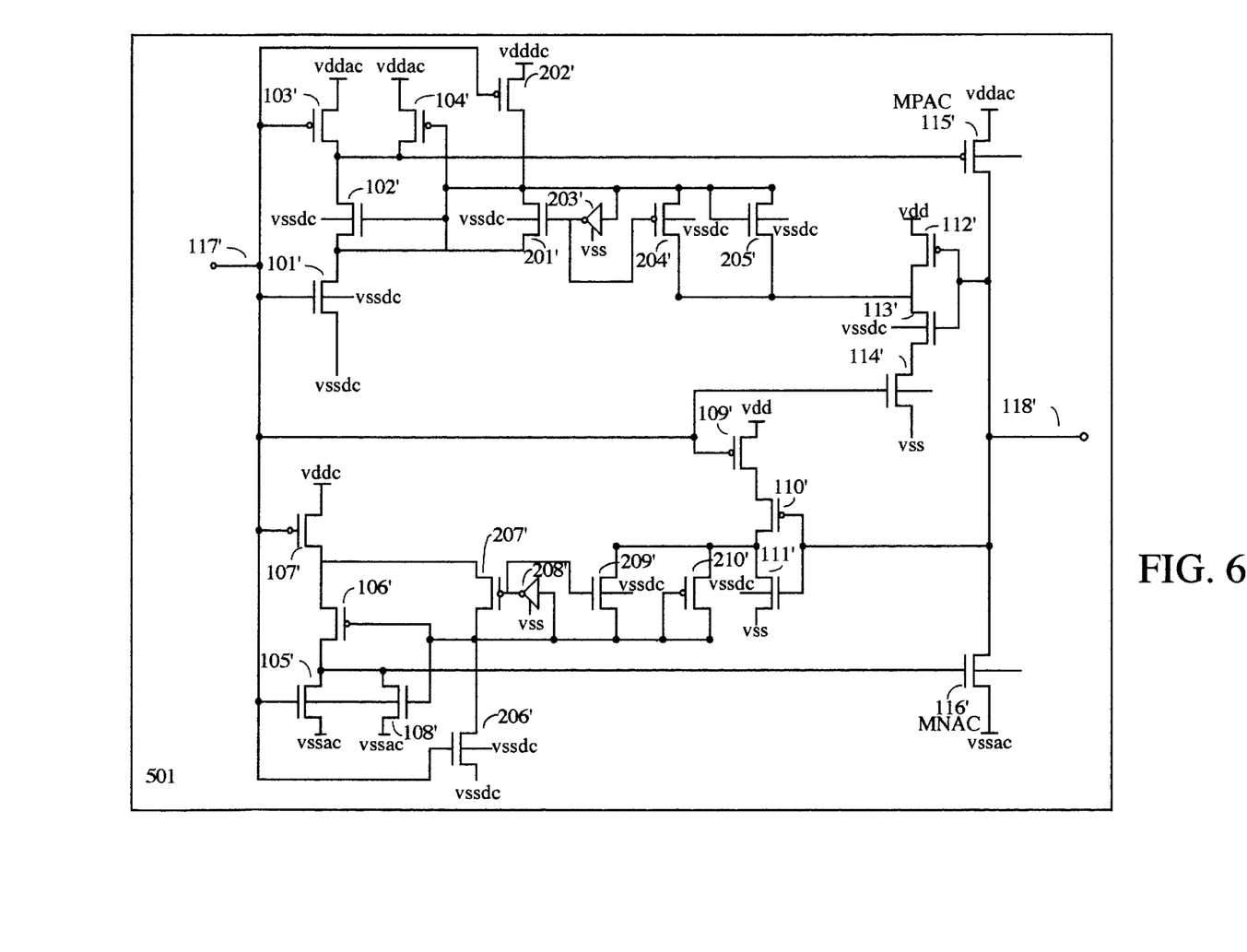
FIG. 6 illustrates a gate-level schematic of the AC driver portion of the I/O buffer circuit shown in FIG. 5.

FIG. 6 illustrates AC driver 502 at the gate-level. Functionally, AC driver 502 does not switch on or off in response to a change at output terminal 118' unless there is a transition at input terminal 117'. As an example, assume initially that the input voltage at input terminal 117' is HIGH and that the output voltage at output terminal 118' has already been driven to a HIGH level. Having a HIGH voltage supplied to its gate, n-mos 105' is turned on and the ground voltage Vss is connected to its drain. This turns off n-mos FET MNAC 116'. At the same time, having a HIGH voltage supplied to its gate turns n-mos FET 101' on and the ground voltage Vss is connected to its drain. Having a HIGH voltage supplied to their gates also turn n-mos FETs 114' and 113' on and the ground voltage Vss is connected to the drain of n-mos FET 113'. Because p-mos FET 204' and n-mos FET 205' still remain on from the previous state of the operation (i.e., when the input voltage at input terminal 117' is LOW), their connected drains are driven LOW. When the voltage at connected drains of p-mos FET 204' and n-mos FET 205 drops below the threshold voltage of inverter 203' inverter 203' outputs a HIGH signal. As a result, n-mos FET 102' is turned off and p-mos FET 104' is turned on. This connected the power voltage Vdd to the drain of p-mos FET 104' thereby turning p-mos FET MPAC 115' off. Additionally, the source of p-mos FET 204' and the drain of n-mos FET 205' are driven LOW thereby turning these devices off.

In the event output ringing or contention causes the output voltage at output terminal 118' to drop to LOW, n-mos FET 114' is turned off and p-mos FET 112' is turned on. The power voltage Vdd is connected to the sources of p-mos FET 204' and 205'. However, because p-mos FET 204' and n-mos FET 205' are off, their sources remain LOW. As a result, n-mos FET 102' is turned off and p-mos FET 104' is turned on. This connects the power voltage Vdd to the drain of p-mos FET 104' thereby keeping p-mos FET MPAC 115' off. At the same time, having a HIGH voltage supplied to the gate of n-mos FET 105' connects the ground voltage Vss to its drain which keeps n-mos FET MNAC 116, turned off.

Following the same logic, if the input voltage at input terminal 117' goes LOW, p-mos FET 103' is turned on to connect the power voltage Vdd to its drain which keeps p-mos FET MPAC 115' off. On the other hand, having a LOW voltage at input terminal 117' turns p-mos FET 107' on to connect the power voltage Vdd to its drain. Since p-mos FET 106' remains on from having a LOW voltage supplied to its gate (i.e., from the previous state when input terminal 117' is LOW), Vdd is supplied to the drain of p-mos FET 106' which turns on n-mos FET MNAC 116' to drive output terminal 118' LOW. AC driver 501 remains in this condition until a subsequent change in input terminal 117'.

Figure 7:
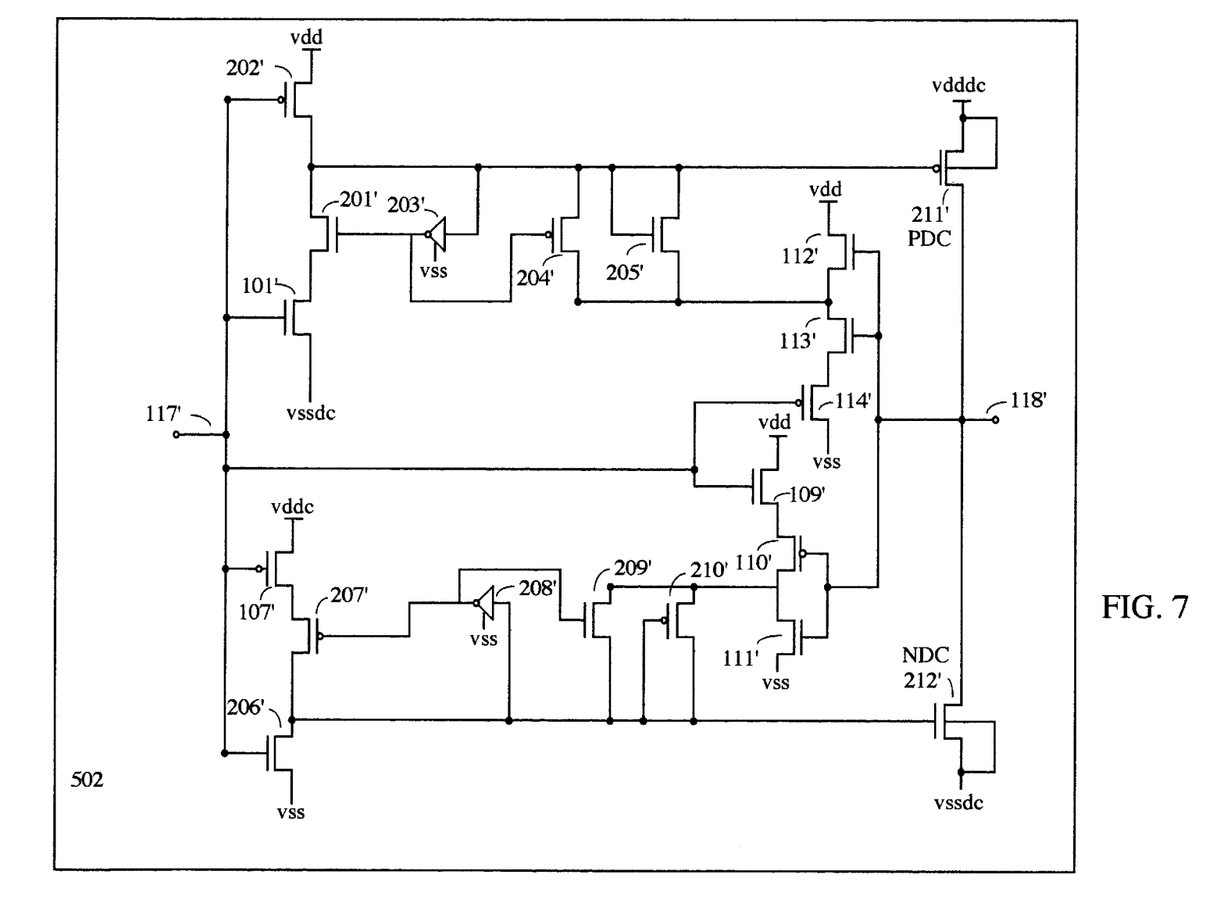
FIG. 7 illustrates a gate-level schematic of the DC driver portion of the I/O buffer circuit shown in FIG. 5.
Figure 8:
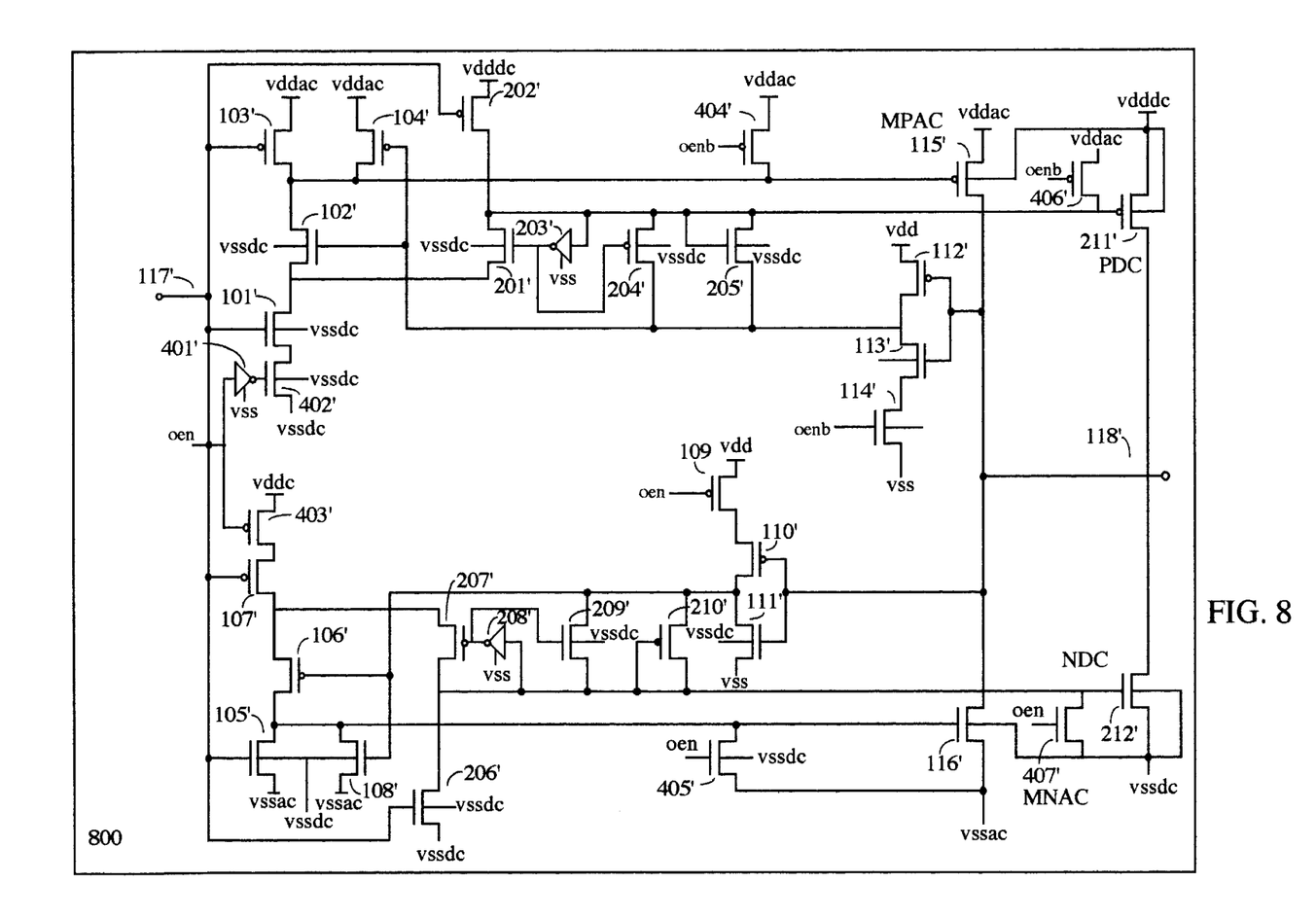
FIG. 8 illustrates a gate-level schematic of the I/O buffer circuit shown in FIG. 5 further including output enable circuitry.

Referring to FIG. 7 which illustrates an embodiment of I/O buffer 500 of FIG. 5 with output enable capability circuitry. The output enable circuitry is very similar both in terms of structure and function to the output enable circuitry discussed in FIG. 4 and hence, will not be discussed further.

The preferred embodiment of the present invention, an I/O buffer with minimized footprint which is less susceptible to voltage spikes caused by switching noise, is thus described. While the present invention has been described in particular embodiments, the present invention should not be construed as limited by such embodiments, but rather construed according to the below claims.

What is claimed is:

1. A noise-isolated I/O buffer with minimized footprint, comprising:

an output terminal;

a level shifting circuit receiving an input signal and an output signal from the output terminal, the level shifting circuit generating a first level shifting signal and a second level shifting signal indicating relative voltage levels of the input and output signals;

a first switching circuit receiving as input the first level shifting signal and the input signal, the first switching circuit generating a first pair of control signals;

a second switching circuit receiving as input the second level shifting signal and the input signal, the second switching circuit generating a second pair of control signals;

a first transistor having a source connected to a first HIGH voltage source, a gate connected to a first signal of the first pair of control signals, and a drain connected to the output terminal;

a second transistor having a source connected to a first LOW voltage source, a gate connected to a first signal of the second pair of control signals, and a drain connected to the output terminal;

a third transistor having a source connected to a second HIGH voltage source, a gate connected to a second signal of the first pair of control signals, and a drain connected to the output terminal;

a fourth transistor having a source connected to a second LOW voltage source, a gate connected to a second signal of the second pair of control signals, and a drain connected to the output terminal;

a first latching circuit connected between the level shifting circuit and the first switching circuit, the first latching circuit maintaining the second signal of the first pair of control signals in a state until there is a change in the input signal; and a second latching circuit connected between the level shifting circuit and the second switching circuit, the second latching circuit maintaining the second signal of the second pair of control signals in a state until there is a change in the input signal;

wherein the first and second transistors causing a logic level of the output terminal to be switched in response a change in the input signal and being turned off in the absence of a change in the input signal, and wherein the third and fourth transistors causing the logic level of the output terminal to be maintained in the absence of a change in the input signal and being turned off in response to a change in the input signal.

2. The noise-isolated I/O buffer of claim 1, wherein the level shifting circuit comprises:

a fifth transistor having a source connected to a third HIGH voltage source, a gate connected to the output terminal, and a drain;

a sixth transistor having a source connected to the third LOW voltage source, a gate connected to the input signal, and a drain;

a seventh transistor having a source connected to the drain of the sixth transistor, a gate connected to the output terminal, and a drain connected to the drain of the fifth transistor;

an eighth transistor having a source connected to the third HIGH voltage source, a gate connected to the input signal, and a drain;

a ninth transistor having a source connected to the third LOW voltage source, a gate connected to the output terminal, and a drain; and a tenth transistor having a source connected to the drain of the eighth transistor, a gate connected to the output terminal, and a drain connected to the drain of the ninth transistor;

wherein the first level shifting signal being output at the drain of the fifth transistor, and wherein the second level shifting signal being output at the drain of the ninth transistor.

3. The noise-isolated I/O buffer of claim 2, wherein the first switching circuit comprises:

an eleventh transistor having a source connected to the first HIGH voltage source, a gate connected to the input signal, and a drain;

a twelfth transistor having a source connected to the second LOW voltage source, a gate connected to the input signal, and a drain;

a thirteenth transistor having a source connected to the drain of the twelfth transistor, a gate, and a drain connected to the drain of the eleventh transistor;

a fourteenth transistor having a source connected to the first HIGH voltage source, a gate connected to the gate of the thirteenth transistor and the first level shifting signal, and a drain connected to the drain of the eleventh transistor, wherein the drain of the fourteenth transistor outputting the first signal of the first pair of control signals;

a fifteenth transistor having a source connected to the second HIGH voltage source, a gate connected to the input signal, and a drain; and a sixteenth transistor having a source connected to the drain of the thirteenth transistor, a gate, and a drain connected to the drain of the fifteenth transistor, wherein the drain of the sixteenth transistor outputting the second signal of the first pair of control signals.

4. The noise-isolated I/O buffer of claim 3, wherein the second switching circuit comprises:

a seventeenth transistor having a source connected to the second HIGH voltage source, a gate connected to the input signal, and a drain;

an eighteenth transistor having a source connected to the first LOW voltage source, a gate connected to the input signal, and a drain;

a nineteenth transistor having a source connected to the drain of the seventeenth transistor, a gate, and a drain connected to the drain of the eighteenth transistor;

a twentieth transistor having a source connected to the first LOW voltage source, a gate connected to the gate of the nineteenth transistor and the second shifting signal, and a drain connected to the drain of the eighteenth transistor, wherein the drain of the twentieth transistor outputting the first signal of the second pair of control signals;

a twenty-first transistor having a source connected to the second LOW voltage source, a gate connected to the input signal, and a drain; and a twenty-second transistor having a source connected to the drain of the seventeenth transistor, a gate, and a drain connected to the drain of the twenty-first transistor, wherein the drain of the twenty-second transistor outputting the second signal of the second pair of control signals.

5. The noise-isolated I/O buffer of claim 4, wherein the first latching circuit comprises:

a first inverter having an input connected to the second signal of the first pair of control signals and an output connected to the gate of the sixteenth transistor; and a twenty-third transistor having a source connected to the first level shifting signal, a gate connected to the output of the first inverter, and a drain connected to the second signal of the first pair of control signals.

6. The noise-isolated I/O buffer of claim 5, wherein the first latching circuit further comprises:

a twenty-fourth transistor having a drain connected to the first level shifting signal, a gate connected to the second signal of the first pair of control signals, and a source connected to the second signal of the first pair of control signals, wherein the twenty-fourth transistor is a different type of transistor than the twenty-third transistor.

7. The noise-isolated I/O buffer of claim 4, wherein the second latching circuit comprises:

a second inverter having an input connected to the second signal of the second pair of control signals and an output connected to the gate of the twenty-second transistor; and a twenty-fifth transistor having a source connected to the second level shifting signal, a gate connected to the output of the second inverter, and a drain connected to the second signal of the second pair of control signals.

8. The noise-isolated I/O buffer of claim 7, wherein the first latching circuit further comprises:

a twenty-sixth transistor having a drain connected to the second level shifting signal, a gate connected to the second signal of the second pair of control signals, and a source connected to the second signal of the second pair of control signals, wherein the twenty-sixth transistor is a different type of transistor than the twenty-fifth transistor.

9. The noise-isolated I/O buffer of claim 1 further comprising an enable circuit, wherein in response to an output enable signal, the enable circuit connecting the second LOW voltage source to the first switching circuit, the enable circuit connecting the second HIGH voltage source to the gate of the third transistor, the enable circuit connecting the first HIGH voltage source to the gate of the first transistor, the enable circuit connecting the third LOW voltage to the level shifting circuit, the enable circuit connecting the second HIGH voltage source to the second switching circuit, the enable circuit connecting the second LOW voltage source to the gate of the fourth transistor, the enable circuit connecting the first LOW voltage source to the gate of the second transistor, and the enable circuit connecting the third HIGH voltage to the level shifting circuit.

10. A noise-isolated I/O buffer with minimized footprint, comprising:

an output terminal;

a level shifting circuit receiving an input signal and an output signal from the output terminal, the level shifting circuit generating a first level shifting signal and a second level shifting signal indicating relative voltage levels of the input and output signals;

a first switching circuit receiving as input the input signal, the first switching circuit generating a first pair of control signals;

a second switching circuit receiving as input the input signal, the second switching circuit generating a second pair of control signals;

a first transistor having a source connected to a first HIGH voltage source, a gate connected to a first signal of the first pair of control signals, and a drain connected to the output terminal;

a second transistor having a source connected to a first LOW voltage source, a gate connected to a first signal of the second pair of control signals, and a drain connected to the output terminal;

a third transistor having a source connected to a second HIGH voltage source, a gate connected to a second signal of the first pair of control signals, and a drain connected to the output terminal;

a fourth transistor having a source connected to a second LOW voltage source, a gate connected to a second signal of the second pair of control signals, and a drain connected to the output terminal;

a first latching circuit connected between the level shifting circuit and the first switching circuit, the first latching circuit maintaining a first signal of the first pair of control signals in a state until there is a change in the input signal; and a second latching circuit connected between the level shifting circuit and the second switching circuit, the second latching circuit maintaining a first signal of the second pair of control signals in a state until there is a change in the input signal;

wherein the first and second transistors causing a logic level of the output terminal to be switched in response a change in the input signal and being turned off in the absence of a change in the input signal, and wherein the third and fourth transistors causing the logic level of the output terminal to be maintained in the absence of a change in the input signal and being turned off in response to a change in the input signal.

11. The noise-isolated I/O buffer of claim 10, wherein the level shifting circuit comprises:

a fifth transistor having a source connected to a third HIGH voltage source, a gate connected to the output terminal, and a drain;

a sixth transistor having a source connected to the third LOW voltage source, a gate connected to the input signal, and a drain;

a seventh transistor having a source connected to the drain of the sixth transistor, a gate connected to the output terminal, and a drain connected to the drain of the fifth transistor;

an eighth transistor having a source connected to the third HIGH voltage source, a gate connected to the input signal, and a drain;

a ninth transistor having a source connected to the third LOW voltage source, a gate connected to the output terminal, and a drain; and a tenth transistor having a source connected to the drain of the eighth transistor, a gate connected to the output terminal, and a drain connected to the drain of the ninth transistor;

wherein the first level shifting signal being output at the drain of the fifth transistor, and wherein the second level shifting signal being output at the drain of the ninth transistor.

12. The noise-isolated I/O buffer of claim 11, wherein the first switching circuit comprises:

an eleventh transistor having a source connected to the first HIGH voltage source, a gate connected to the input signal, and a drain;

a twelfth transistor having a source connected to the second LOW voltage source, a gate connected to the input signal, and a drain;

a thirteenth transistor having a source connected to the drain of the twelfth transistor, a gate, and a drain connected to the drain of the eleventh transistor;

a fourteenth transistor having a source connected to the first HIGH voltage source, a gate connected to the gate of the thirteenth transistor, and a drain connected to the drain of the eleventh transistor, wherein the drain of the fourteenth transistor outputting the first signal of the first pair of control signals;

a fifteenth transistor having a source connected to the second HIGH voltage source, a gate connected to the input signal, and a drain connected to the gate of the fourteenth transistor; and a sixteenth transistor having a source connected to the drain of the thirteenth transistor, a gate, and a drain connected to the drain of the fifteenth transistor and the gate of the fourteenth transistor, wherein the drain of the sixteenth transistor outputting the second signal of the first pair of control signals.

13. The noise-isolated I/O buffer of claim 12, wherein the second switching circuit comprises:

a seventeenth transistor having a source connected to the second HIGH voltage source, a gate connected to the input signal, and a drain;

an eighteenth transistor having a source connected to the first LOW voltage source, a gate connected to the input signal, and a drain;

a nineteenth transistor having a source connected to the drain of the seventeenth transistor, a gate, and a drain connected to the drain of the eighteenth transistor;

a twentieth transistor having a source connected to the first LOW voltage source, a gate connected to the gate of the nineteenth transistor, and a drain connected to the drain of the eighteenth transistor, wherein the drain of the twentieth transistor outputting the first signal of the second pair of control signals;

a twenty-first transistor having a source connected to the second LOW voltage source, a gate connected to the input signal, and a drain; and a twenty-second transistor having a source connected to the drain of the seventeenth transistor, a gate, and a drain connected to the drain of the twenty-first transistor and the gate of the twentieth transistor, wherein the drain of the twenty-second transistor outputting the second signal of the second pair of control signals.

14. The noise-isolated I/O buffer of claim 13, wherein the first latching circuit comprises:

a first inverter having an input connected to the second signal of the first pair of control signals and an output connected to the gate of the sixteenth transistor; and a twenty-third transistor having a source connected to the first level shifting signal, a gate connected to the output of the first inverter, and a drain connected to the second signal of the first pair of control signals.

15. The noise-isolated I/O buffer of claim 14 wherein the first latching circuit further comprises:

a twenty-fourth transistor having a drain connected to the first level shifting signal, a gate connected to the second signal of the first pair of control signals, and a source connected to the second signal of the first pair of control signals, wherein the twenty-fourth transistor is a different type of transistor than the twenty-third transistor.

16. The noise-isolated I/O buffer of claim 15, wherein the second latching circuit comprises:

a second inverter having an input connected to the second signal of the second pair of control signals and an output connected to the gate of the twenty-second transistor; and a twenty-fifth transistor having a source connected to the second level shifting signal, a gate connected to the output of the second inverter, and a drain connected to the second signal of the second pair of control signals.

17. The noise-isolated I/O buffer of claim 16, wherein the first latching circuit further comprises:

a twenty-sixth transistor having a drain connected to the second level shifting signal, a gate connected to the second signal of the second pair of control signals, and a source connected to the second signal of the second pair of control signals, wherein the twenty-sixth transistor is a different type of transistor than the twenty-fifth transistor.

18. The noise-isolated I/O buffer of claim 10 further comprising an enable circuit, wherein in response to an output enable signal, the enable circuit connecting the second LOW voltage source to the first switching circuit, the enable circuit connecting the second HIGH voltage source to the gate of the third transistor, the enable circuit connecting the first HIGH voltage source to the gate of the first transistor, the enable circuit connecting the third LOW voltage to the level shifting circuit, the enable circuit connecting the second HIGH voltage source to the second switching circuit, the enable circuit connecting the second LOW voltage source to the gate of the fourth transistor, the enable circuit connecting the first LOW voltage source to the gate of the second transistor, and the enable circuit connecting the third HIGH voltage to the level shifting circuit.

* * * * *